United States Patent
Sakai et al.

[11] Patent Number: 5,802,712
[45] Date of Patent: Sep. 8, 1998

[54] ELECTRONIC DEVICE MOUNTING METHOD

[75] Inventors: Tadahiko Sakai; Shoji Sakemi, both of Fukuoka, Japan

[73] Assignee: Matsushita Electric Industrial Co., Ltd., Osaka, Japan

[21] Appl. No.: 604,895

[22] Filed: Feb. 22, 1996

[30] Foreign Application Priority Data

Feb. 23, 1995 [JP] Japan .................................. 7-035189

[51] Int. Cl.⁶ .................................................. H05K 3/34
[52] U.S. Cl. ........................................ 29/840; 228/180.22
[58] Field of Search .................... 29/840, 832; 174/260; 228/180.21, 180.22

[56] References Cited

U.S. PATENT DOCUMENTS

| | | | |
|---|---|---|---|
| 4,825,284 | 4/1989 | Soga et al. | 257/717 |
| 4,897,918 | 2/1990 | Osaka et al. | 29/840 |
| 5,192,835 | 3/1993 | Bull et al. | 174/260 |
| 5,489,750 | 2/1996 | Sakemi et al. | 29/840 |

*Primary Examiner*—P. W. Echols
*Attorney, Agent, or Firm*—Pollock, Vande Sande & Priddy

[57] ABSTRACT

An electronic device includes a substrate, a chip attached thereon, and a molded body formed on the substrate for sealing the chip on the substrate. The electronic device further includes bumps formed at the underside of the substrate for connection to electrodes of a printed board. In an electronic device mounting method, a first correlation between a magnitude of warp of the electronic device and a heating temperature of the electronic device is derived. The warp is caused by a difference in thermal expansion coefficient between the molded body and the substrate. In the method, a second correlation between the magnitude of warp of the electronic device and a failure rate of coupling between the bumps and the electrodes is further derived. The method further derives, based on the first and second correlations, a heating temperature which causes no coupling failure between the bumps and the electrodes. Then, the electronic device is heated up to a temperature no less than the derived heating temperature causing no coupling failure so as to melt the bumps for fixation onto the electrodes of the printed board.

3 Claims, 4 Drawing Sheets

ELECTRONIC DEVICE MOUNTING METHOD

BACKGROUND OF THE INVENTION

1. Field of the Invention

The present invention relates to a method of mounting or attaching an electronic device to a printed board, wherein bumps (protruding electrodes) of the electronic device are fixed to electrodes of the printed board.

2. Description of the Prior Art

As is known, an electronic device has a substrate, a chip attached thereon, and a molded body of synthetic resin formed on the substrate for sealing the chip on the substrate. The electronic device further includes bumps formed at the underside of the substrate for connection to a printed board. The electronic device thus structured is placed on the printed board by matching positions of the bumps with corresponding electrodes of a circuit pattern of the printed board. Then, the printed board with the electronic device placed thereon is transferred to a furnace to be heated so that the bumps are heated to melt. Subsequently, the molten bumps are cooled to solidify and thus fixed onto the corresponding electrodes of the printed board so that the electronic device is mounted onto the printed board.

Hereinbelow, the conventional electronic device mounting method will be explained in further detail.

In FIGS. 6A and 6B, numeral 1 denotes an electronic device, numeral 2 a substrate, numeral 3 a molded body of synthetic resin, numerals 4 bumps of the electronic device 1, numeral 5 a printed board and numerals 6 electrodes of a circuit pattern of the printed board 5. FIG. 6A shows the state before the bumps 4 are heated and cooled to be fixed onto the electrodes 6 of the printed board 5, while FIG. 6B shows the state after the bumps 4 are heated and cooled to be fixed onto the electrodes 6 of the printed board 5. As shown in FIG. 6A, the electronic device 1 is liable to be subjected to a warp W. The warp W occurs due to hardening contraction of the molded body 3 which is generated upon forming the molded body 3. In other words, the warp W occurs due to a difference in thermal expansion coefficient between the substrate 2 and the molded body 3.

After the electronic device 1 is placed on the printed board 5 as shown in FIG. 6A, the printed board 5 with the electronic device 1 placed thereon is transferred to the furnace to be heated so that the bumps 4 are heated to melt. Thereafter, the bumps 4 are cooled to solidify and thus fixed to the electrodes 6 of the printed board 5 as shown in FIG. 6B.

However, in the foregoing conventional method, when the warp W is large, the bumps 4 located at both side ends of the electronic device 1 can not come in contact with the electrodes 6 of the printed board 5 as shown in FIG. 6B. Thus, the defective unit of the electronic device 1 and the printed board 5 is produced.

SUMMARY OF THE INVENTION

Therefore, it is an object of the present invention to provide an improved electronic device mounting method.

According to one aspect of the present invention, a method of mounting an electronic device to a printed board, wherein the electronic device has a molded body of synthetic resin formed on a substrate thereof for sealing a chip on the substrate and is further formed with bumps at an underside of the substrate for connection to electrodes of the printed board, comprises the steps of deriving a first correlation between a magnitude of warp of the electronic device and a heating temperature of the electronic device, the warp caused by a difference in thermal expansion coefficient between the molded body and the substrate; deriving a second correlation between the magnitude of warp of the electronic device and a failure rate of coupling between the bumps and the electrodes; deriving a heating temperature, which causes no coupling failure between the bumps and the electrodes, based on the first and second correlations; and heating the electronic device to a temperature no less than the heating temperature which causes no coupling failure so as to melt the bumps for fixation onto the electrodes of the printed board.

It may be arranged that the electronic device is heated up to the temperature which achieves the magnitude of warp of the electronic device to no more than 80 $\mu$m.

According to another aspect of the present invention, a method of mounting an electronic device to a printed board, wherein the electronic device has a molded body of synthetic resin formed on a substrate thereof for sealing a chip on the substrate and is further formed with bumps at an underside of the substrate for connection to electrodes of the printed board, comprises the steps of heating the electronic device to a temperature which achieves a magnitude of warp of the electronic device of no more than 80 $\mu$m, so as to melt the bumps for fixation onto the electrodes of the printed board, the warp caused by a difference in thermal expansion coefficient between the molded body and the substrate.

BRIEF DESCRIPTION OF THE DRAWINGS

The present invention will be understood more fully from the detailed description given hereinbelow, taken in conjunction with the accompanying drawings.

In the drawings:

FIGS. 1A, 1B and 1C are diagrams, respectively, for explaining an electronic device mounting method according to a preferred embodiment of the present invention, wherein FIG. 1A shows a state before bumps of an electronic device are fixed to electrodes of a printed board, FIG. 1B shows a state while the bumps are heated to melt and FIG. 1C shows a state after the bumps are fixed to the electrodes of the printed board;

FIGS. 6A and 6B are diagrams, respectively, for explaining a conventional electronic device mounting method, wherein FIG. 6A shows a state before bumps of an electronic device are fixed to electrodes of a printed board and FIG. 6B shows a state after the bumps of the electronic device are fixed to the electrodes of the printed board.

DESCRIPTION OF THE PREFERRED EMBODIMENT

Now, a preferred embodiment of the present invention will be described hereinbelow with reference to the accompanying drawings. The same or like components are represented by the same reference signs throughout the figures.

Figure 1A:
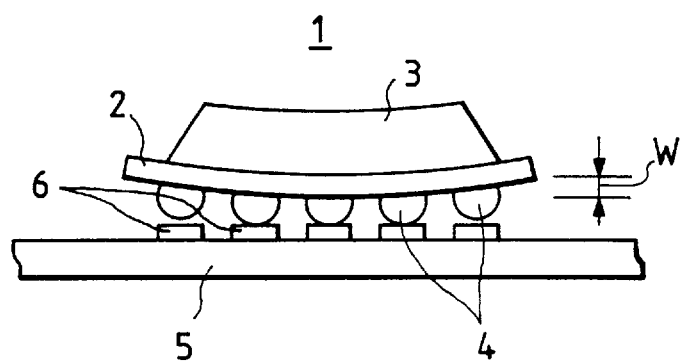
Figure 1B:
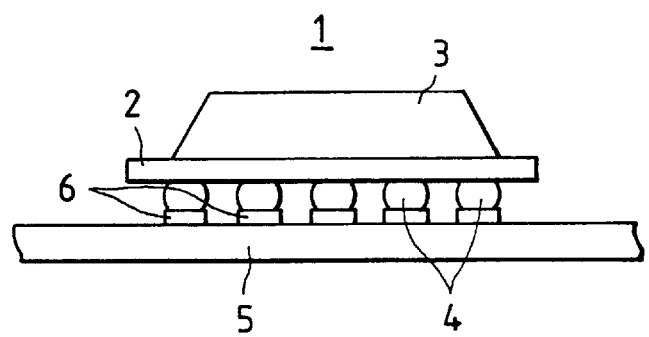
Figure 1C:
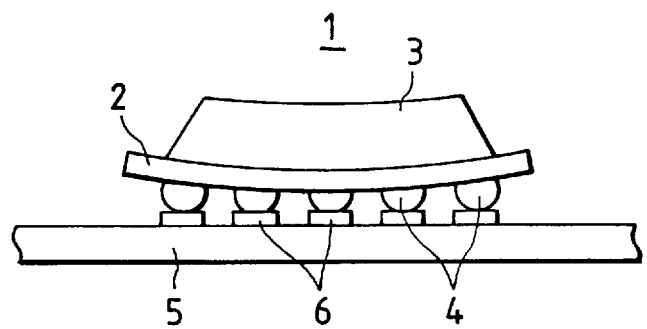

FIGS. 1A, 1B and 1C are diagrams, respectively, for explaining an electronic device mounting method according to the preferred embodiment of the present invention. Specifically, FIG. 1A is a front view showing an electronic device 1 arranged on a printed board 5 before bumps 4 of the electronic device 1 are heated and cooled to be fixed to corresponding electrodes 6 of a circuit pattern of the printed board 5. FIG. 1B is a front view showing the electronic device 1 arranged on the printed board 5 while the bumps 4 of the electronic device 1 are heated to melt. FIG. 1C is a front view showing the electronic device 1 arranged on the printed board 5 after the bumps 4 of the electronic device 1 are heated and cooled to be fixed to the corresponding electrodes 6 of the circuit pattern of the printed board 5. In the figures, numeral 2 denotes a substrate of the electronic device 1 on which the chip is attached, and numeral 3 denotes a molded body of synthetic resin formed on the substrate 2 for sealing the chip on the substrate 2.

As shown in FIG. 1A and as described before, the electronic device 1 is liable to be subjected to a warp W which occurs due to a difference in thermal expansion coefficient between the substrate 2 and the molded body 3.

In this preferred embodiment, after the electronic device 1 is placed on the printed board 5 with positions of the bumps 4 matching the corresponding electrodes 6 of the printed board 5 as shown in FIG. 1A, the printed board 5 with the electronic device 1 placed thereon is transferred to a furnace (not shown) so as to be heated to no less than 230° C. which will be described later. Then, as shown in FIG. 1B, the warp W of the electronic device 1 is substantially cured or canceled so that all the heated molten bumps 4 come in contact with the corresponding electrodes 6 of the printed board 5. Thereafter, the bumps 4 are cooled to solidify and thus fixed on the electrodes 6 as shown in FIG. 1C.

As described above, according to the electronic device mounting method of this preferred embodiment, the warp W of the electronic device 1 is substantially canceled during heating in the furnace so that all the bumps 4 are fixed onto the electrodes 6 of the circuit board 5. The reason for this will be explained hereinbelow.

Figure 2:
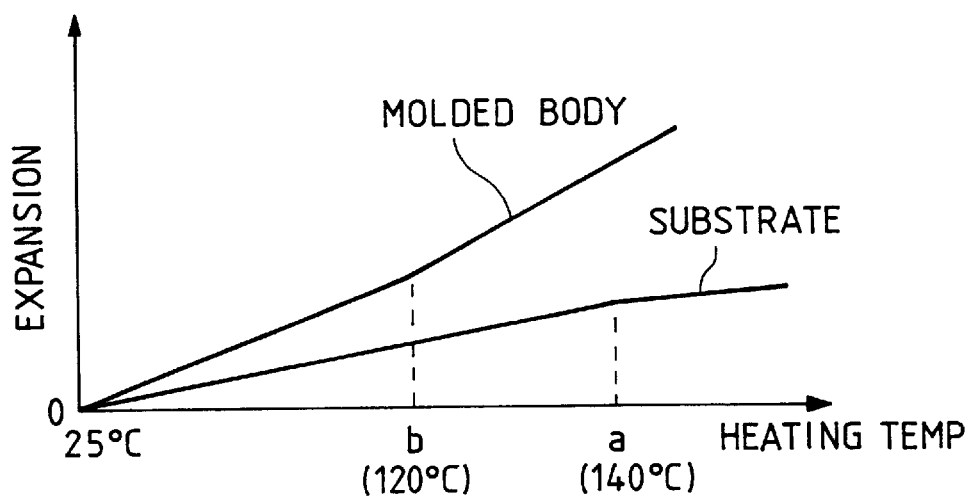
FIG. 2 is a characteristic diagram showing correlation between heating temperatures and magnitudes of expansion of a substrate and a molded body of the electronic device according to the preferred embodiment of the present invention.
Figure 3:
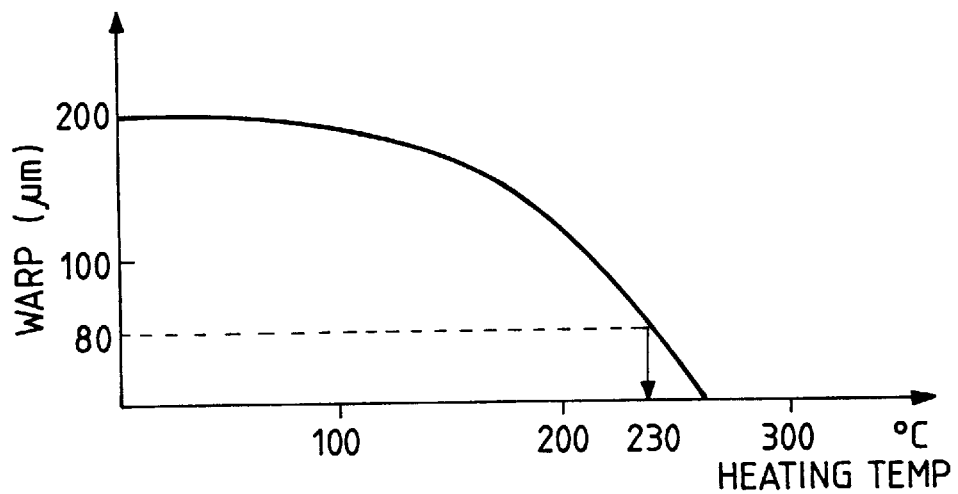
FIG. 3 is a characteristic diagram showing correlation between heating temperatures and magnitudes of warp of the electronic device according to the preferred embodiment of the present invention.
Figure 4:
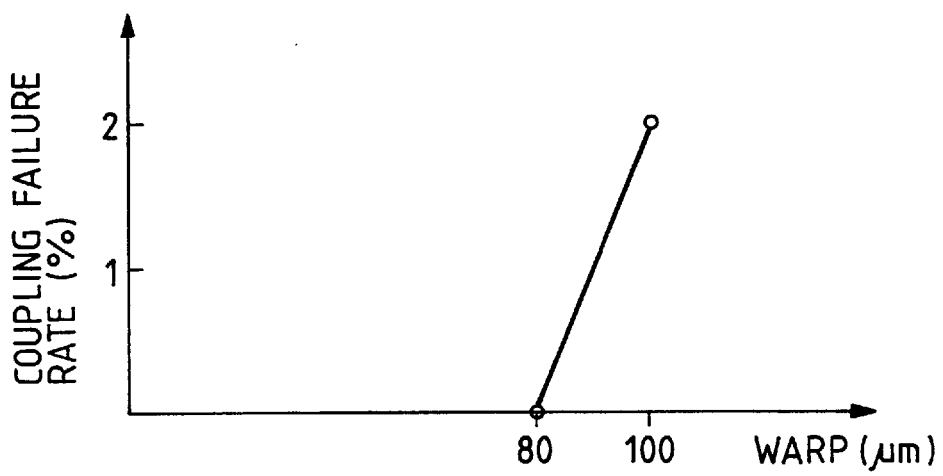
FIG. 4 is a characteristic diagram showing correlation between magnitudes of warp of the electronic device and failure rates of coupling between the bumps of the electronic device and the electrodes of the printed board according to the preferred embodiment of the present invention.
Figure 5:
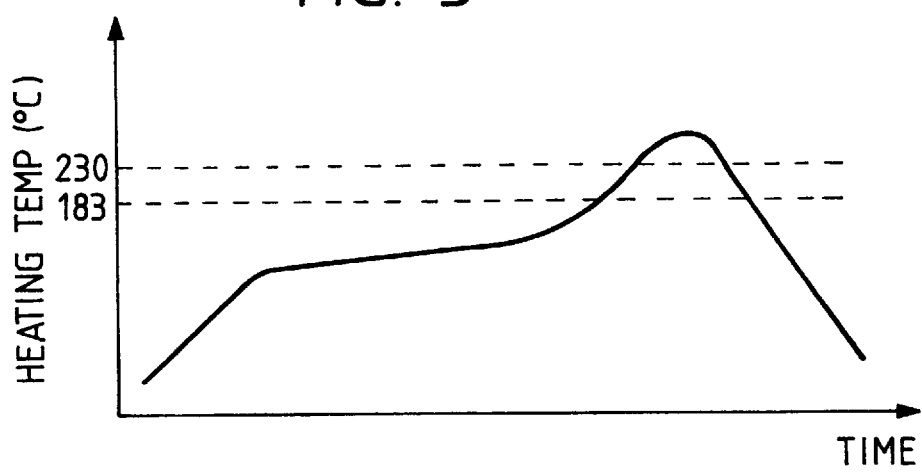
FIG. 5 is a diagram showing a temperature profile, in a furnace, of one example according to the preferred embodiment of the present invention.
Figure 6A:
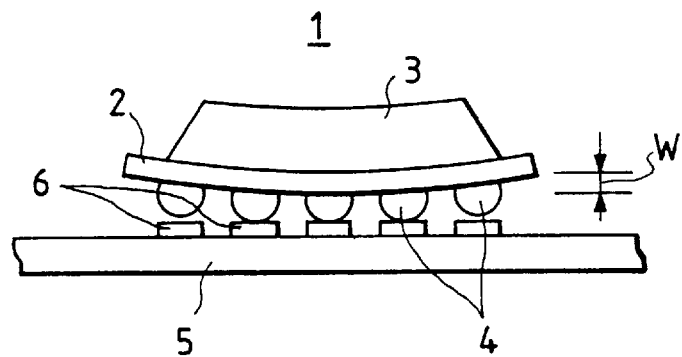
Figure 6B:
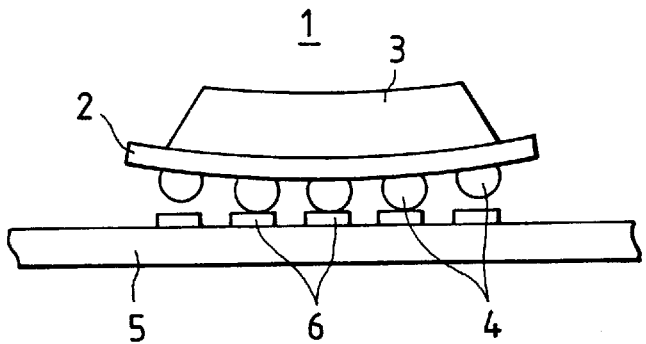

FIG. 2 is a characteristic diagram showing correlation between heating temperatures and magnitudes of expansion of the substrate 2 and the molded body 3 of the electronic device 1. FIG. 3 is a characteristic diagram showing correlation between heating temperatures and magnitudes of warp of the electronic device 1. FIG. 4 is a characteristic diagram showing correlation between magnitudes of warp of the electronic device 1 and failure rates of coupling between the bumps 4 of the electronic device 1 and the electrodes 6 of the printed board 5. FIG. 5 is a diagram showing a temperature profile, in the furnace, of one example according to this preferred embodiment.

In this preferred embodiment, the substrate 2 is formed of glass epoxy resin and the molded body 3 is formed of epoxy resin. Accordingly, as shown in FIG. 2, a thermal expansion coefficient changes to be greater at a glass transition point b (about 120° C.) for the molded body 3, while a thermal expansion coefficient changes to be smaller at a temperature a (about 140° C.) for the substrate 2.

As shown in FIG. 3, the warp W of the electronic device 1 decreases as the heating temperature in the furnace increases. Specifically, the warp W is reduced to 80 $\mu$m when the heating temperature increases to 230° C., and the warp W is further reduced to substantially zero around 265° C. The reason for this is as follows: As shown in FIG. 2, the expansion magnitude of the molded body 3 increases relative to the expansion magnitude of the substrate 2 and thus a difference therebetween increases as the heating temperature increases. As a result, a difference in contraction between the substrate 2 and the molded body 3 which causes the warp W of the electronic device 1 is canceled to a greater extent as the heating temperature increases.

On the other hand, in this preferred embodiment, a height of the bump 4 is set to be about 600 $\mu$m. In this case, as shown in FIG. 4, a coupling failure rate becomes zero when the warp W is reduced to no more than 80 $\mu$m.

As shown in FIG. 5 and as described above, in this preferred embodiment, the heating temperature is increased up to no less than 230° C. so that the warp W is reduced to no more than 80 $\mu$m, thereby leading to no coupling failure between the bumps 4 and the electrodes 6 as shown in FIG. 1B. Although the electronic device 1 warps again through the subsequent cooling process, no separation between the bumps 4 and the electrodes 6 is caused as shown in FIG. 1C. In FIG. 5, 183° C. represents a melting point of a soldering material used for the bumps 4.

As appreciated, a temperature which can achieve the warp W no more than 80 $\mu$m varies depending on materials of the substrate 2 and the molded body 3.

As described above, in the electronic device mounting method according to the preferred embodiment of the present invention, even when the electronic device has a large warp due to a difference in thermal expansion coefficient between the substrate and the molded body, the warp of the electronic device is substantially canceled during heating so that all the bumps can be fixed onto the electrodes of the printed board.

While the present invention has been described in terms of the preferred embodiment, the invention is not to be limited thereto, but can be embodied in various ways without departing from the principle of the invention as defined in the appended claims.

What is claimed is:

1. A method of mounting an electronic device to a printed board, said electronic device having a molded body of synthetic resin formed on a substrate thereof for sealing a chip on said substrate, said electronic device further formed with bumps at an underside of said substrate for connection to electrodes of said printed board, said molded body and said substrate having different thermal expansion coefficients, said method comprising the steps of:

deriving a first correlation between a magnitude of warp of said electronic device and a heating temperature of said electronic device, said warp caused by a difference in thermal expansion coefficient between said molded body and said substrate;

deriving a second correlation between the magnitude of warp of said electronic device and a failure rate of coupling between said bumps and said electrodes;

deriving a heating temperature, which causes no coupling failure between said bumps and said electrodes, based on said first and second correlations; and heating said electronic device to a temperature not less than said heating temperature which causes no coupling failure so as to melt said bumps for fixation onto said electrodes of the printed board.

2. The method according to claim 1, wherein said electronic device is heated to the temperature which achieves the magnitude of warp of said electronic device of no more than 80 $\mu$m.

3. The method of claim 2 where said bumps have a height of substantially 600 $\mu$m.

* * * * *